United States Patent
Cai et al.

(10) Patent No.: US 7,180,132 B2
(45) Date of Patent: Feb. 20, 2007

(54) ENHANCED RESURF HVPMOS DEVICE WITH STACKED HETERO-DOPING RIM AND GRADUAL DRIFT REGION

(75) Inventors: Jun Cai, Scarborough, ME (US); Michael Harley-Stead, Portland, ME (US); Jim G. Holt, Los Altos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 130 days.

(21) Appl. No.: 10/942,318

(22) Filed: Sep. 16, 2004

(65) Prior Publication Data

US 2006/0057784 A1    Mar. 16, 2006

(51) Int. Cl.
    *H01L 29/78*    (2006.01)
(52) U.S. Cl. .................. 257/342; 257/341; 257/492; 257/493; 257/E29.256
(58) Field of Classification Search ............. 257/341, 257/342, E29.256, E29.255, 493, 492, 339
See application file for complete search history.

(56) References Cited

U.S. PATENT DOCUMENTS

| | | | | |
|---|---|---|---|---|
| 5,132,753 | A * | 7/1992 | Chang et al. ............... | 257/655 |
| 5,286,995 | A * | 2/1994 | Malhi ........................ | 257/549 |
| 5,545,908 | A * | 8/1996 | Tokura et al. ............. | 257/341 |
| 5,705,835 | A * | 1/1998 | Nishiura et al. ............ | 257/147 |
| 6,066,863 | A * | 5/2000 | Fujishima .................. | 257/133 |
| 6,307,224 | B1 * | 10/2001 | Shirai ....................... | 257/288 |
| 6,476,457 | B2 * | 11/2002 | Oh ........................... | 257/492 |
| 6,528,849 | B1 * | 3/2003 | Khemka et al. ............ | 257/342 |
| 6,563,171 | B2 * | 5/2003 | Disney ...................... | 257/342 |
| 6,750,489 | B1 * | 6/2004 | Merrill ...................... | 257/292 |
| 6,753,575 | B2 * | 6/2004 | Efland et al. .............. | 257/343 |
| 6,870,223 | B2 * | 3/2005 | Kumagai et al. ........... | 257/343 |
| 6,894,350 | B2 * | 5/2005 | Shimizu et al. ............ | 257/343 |
| 6,897,525 | B1 * | 5/2005 | Kikuchi et al. ............. | 257/343 |
| 7,022,560 | B2 * | 4/2006 | Olofsson ................... | 438/163 |
| 2003/0089947 | A1 * | 5/2003 | Kawaguchi et al. ........ | 257/341 |
| 2004/0251492 | A1 * | 12/2004 | Lin ........................... | 257/335 |

OTHER PUBLICATIONS

S. Sze, "Physics of Semiconductor Devices," 1981, 2nd Edition, pp. 32.*
S. Wolf, "Silicon Processing for the VLSI Era: Process Technology," 1986, vol. 1, pp. 124.*

* cited by examiner

*Primary Examiner*—B. William Baumeister
*Assistant Examiner*—Steven J. Fulk
(74) *Attorney, Agent, or Firm*—Thomas R. FitzGerald, Esq.; Hiscock & Barclay, LLP

(57) ABSTRACT

An HV PMOS device formed on a substrate having an HV well of a first polarity type formed in an epitaxial layer of a second polarity type includes a pair of field oxide regions on the substrate and at least partially over the HV well. Insulated gates are formed on the substrate between the field oxide regions. Stacked hetero-doping rims are formed in the HV well and in self-alignment with outer edges of the gates. A buffer region of the first polarity type is formed in the HV well between and in self-alignment with inner edges of the gates. A drift region of the second polarity type is formed in the buffer region between and in self-alignment with inner edges of the gates. The drift region includes a region having a gradual dopant concentration change, and includes a drain region of the second polarity type.

8 Claims, 7 Drawing Sheets

ENHANCED RESURF HVPMOS DEVICE WITH STACKED HETERO-DOPING RIM AND GRADUAL DRIFT REGION

FIELD OF THE INVENTION

The present invention relates generally to integrated circuit devices and a method of fabricating same. More particularly, the present invention relates to integrated circuits in which a high-voltage device and a low-voltage circuit or device are fabricated on the same substrate.

DESCRIPTION OF THE RELATED ART

High-voltage integrated circuits (ICs) often integrate at least one high-voltage device, such as a high-voltage or power transistor, on the same chip or substrate with one or more low-voltage circuits, such as logic devices. In such ICs, the high-voltage transistor is often configured as a lateral double-diffused metal oxide semiconductor (LDMOS) field effect transistor (FET) or a high voltage metal oxide semiconductor (HVMOS) field effect transistor (FET). Fabricating high voltage transistors and logic devices on the same substrate, however, generally involves a tradeoff between competing design objectives for each architecture.

More particularly, in deep sub-micron technology low voltage logic devices are fabricated using processes that produce relatively small geometries and shallow junctions. Conversely, a typical thermal diffusion used to fabricate a high voltage device occurs at a much higher temperature and longer diffusion time in order to establish the relatively deep diffusion regions required for the devices to withstand higher operating voltages. Such deep diffusion processes are not compatible with the smaller geometry and shallow junctions of the logic devices. The high-temperature long duration diffusion process used to fabricate a high voltage device would very likely destroy the shallow junctions of any logic device exposed thereto. Fabricating the high voltage device before the low voltage devices avoids exposing the low voltage devices to the high-temperature diffusion processes, but precludes self alignment of key structures of the high voltage device, such as, for example, the LDMOS p-body, with the gate polysilicon. Therefore, LDMOS devices fabricated in such a manner will have relatively long gate poly lengths, large values of channel resistance, and increased device size.

One approach to fabricating high voltage devices on the same substrate as logic devices is referred to as reduced surface field (RESURF) technology. RESURF technology is desirable in that it achieves increased breakdown voltage and yet maintains a relatively low on-state resistance in the high voltage devices produced thereby. RESURF devices include a lightly-doped region, often referred to as a drift region, that is formed between the drain and channel regions. A field shaping layer is sometimes used to achieve further improvements in the breakdown voltage on-state resistance of the devices. RESURF devices may also incorporate a reduced-thickness epitaxial layer having an increased dopant concentration. By redistributing the electric field density inside a high voltage transistor, a low on-state resistance can be obtained.

However, problems exist in manufacturing high voltage p-type devices using RESURF technology or containing RESURF features. For example, the on-resistance of the high voltage PMOS device typically remains relatively high in such devices. RESURF devices are also very sensitive to impurity segregation that occurs in the lightly-doped drift region during formation or growth of an overlying oxide layer. This sensitivity to impurity segregation is particularly evident in the p-type drift region of p-type high voltage devices where a vertical shallow junction readily forms due to the impurity segregation and thereby makes the formation of p-channel HV PMOS devices with the desired operating characteristics challenging.

Therefore, what is needed in the art is an improved method of fabricating an integrated circuit that combines high voltage p-type devices, high voltage n-type devices and low voltage logic devices on the same substrate.

Furthermore, what is needed in the art is an improved or enhanced RESURF high voltage p-type device that is less sensitive to impurity segregation, and a method of fabricating same.

Still further, what is needed in the art is an improved or enhanced RESURF high voltage p-type device that has improved breakdown performance, an improved/larger safe operating area (SOA), and a method of fabricating same.

Moreover, what is needed in the art is an improved or enhanced RESURF high voltage p-type device that has reduced on-state resistance, and a method of fabricating same.

SUMMARY OF THE INVENTION

The present invention provides an enhanced RESURF high voltage PMOS device having stacked hetero-doping rims and a region of gradual dopant concentration change, and provides improved breakdown voltage, reduced on-state resistance and a large safe operating area.

The invention comprises, in one form thereof, a substrate having an HV well of a first polarity type formed in an epitaxial layer of a second polarity type. A pair of field oxide regions is formed on the substrate and at least partially over the HV well. Insulated gates are formed on the substrate between the field oxide regions. Stacked hetero-doping rims are formed in the HV well and in self-alignment with outer edges of the gates. A buffer region of the first polarity type is formed in the HV well between and in self-alignment with inner edges of the gates. A drift region of the second polarity type is formed in the buffer region between and in self-alignment with inner edges of the gates. The drift region includes a region having a gradual dopant concentration change, and includes a drain region of the second polarity type.

Several advantages are obtained by the device the present invention and the method used to fabricate such a device. First, the n-buffer and p-drift regions are formed with one mask layer and are implanted with hetero-dopants. Secondly, the NLDD and n-buffer layers are respectively used to control, at least in part, the threshold and punch-through voltages of the device, and thus provide for increased flexibility in device and process design. Further, the p-drift layer and n-buffer are stacked together to form enhanced RESURF thereby reducing the on-state resistance and improving breakdown performance of the HV PMOS device of the present invention. The n-buffer layer also helps to increase p-drift region doping concentration for low on-state resistance and, therefore, also reduces the sensitivity or susceptibility of the p-drift region to impurity segregation. Moreover, after etching of the gate polysilicon to process the p-drift region implant, the impurity segregation effect in the p-drift region is substantially reduced since no high temperature oxide growth is carried out.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
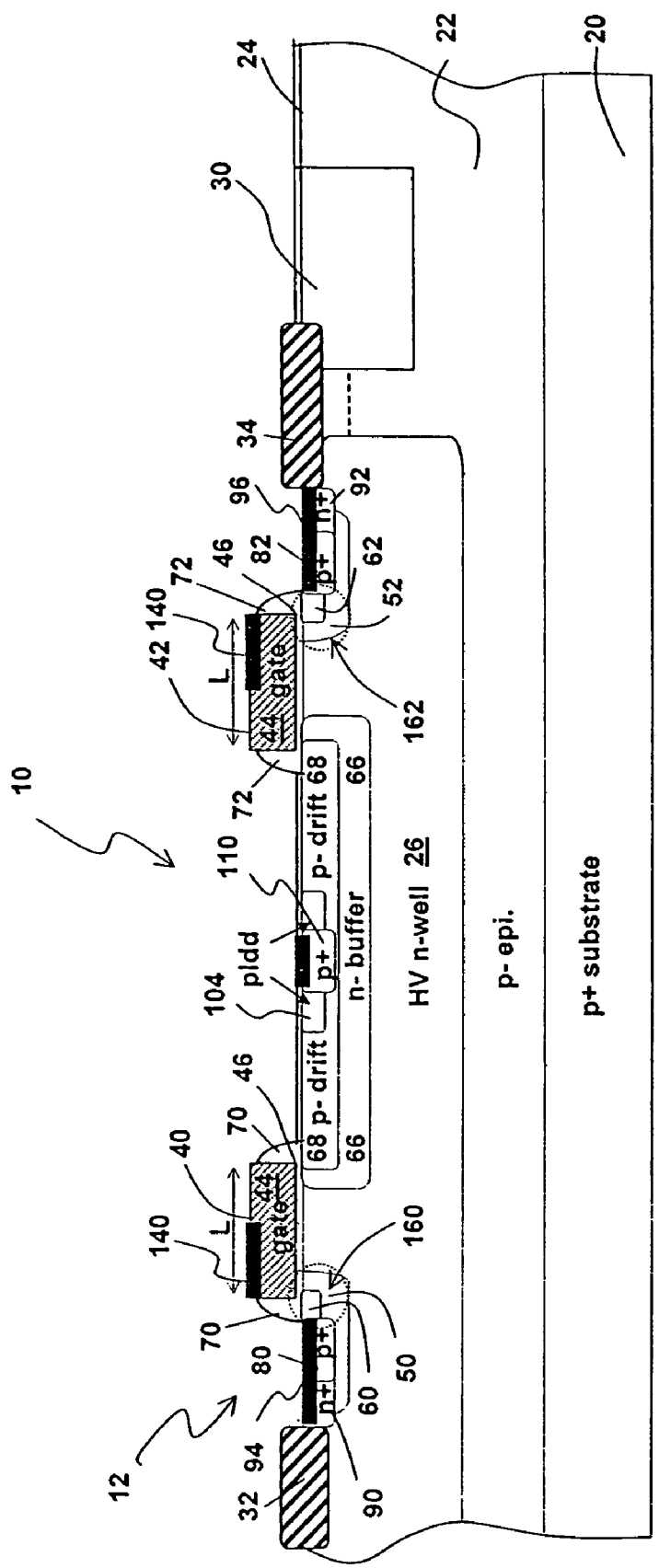
FIG. 1 is a cross-sectional view of one embodiment of an integrated circuit device of the present invention.

Referring now to the drawings and particularly to FIG. 1, one embodiment of an integrated circuit (IC) of the present invention is shown. Generally, and as is more particularly described hereinafter, IC 10 includes an HV PMOS device 12 having stacked hetero-doping rims and a p-type drift layer with a step drain formed in an n-type buffer layer, which serves as an enhanced RESURF area. The dopant concentration of the p-type drift layer gradually decreases from the drain toward the gate. The above-mentioned features/structures of HV PMOS device 12 improve the threshold voltage control, increase the breakdown and punch through voltages, enlarge the safe operating area, and reduce the on-state resistance of the device.

More particularly, IC 10 is formed on a semiconductor monocrystalline substrate 20, such as, for example, a p– or p+ type silicon substrate. Epitaxial layer 22 is formed, such as, for example, grown or deposited, on substrate 20. Epitaxial layer 22 has an upper surface 24. HV n-well 26 is formed within epitaxial layer 22, and HV PMOS device 12 is formed therein, as is more particularly described hereinafter. Low voltage circuitry generally designated 30, such as, for example, low voltage logic devices, are formed in epitaxial layer 22. Field oxide (FOX) regions 32 and 34 are formed in known manner on epitaxial layer 22, and serve as lateral isolation regions that separate HV PMOS device 12 from the low voltage devices 30 formed in layer 22.

HV PMOS device 12 includes gates 40 and 42 are formed in a known manner from a patterned layer of highly-doped and therefore conductive polysilicon 44 that is disposed upon a layer of gate oxide 46. HV PMOS device 12 further includes a first n-type tub 50 (or, alternatively, an n-type lightly-doped drain (NLDD) region formed with appropriate dose and implant energy) formed in self-alignment with an outer edge of the portion of polysilicon layer 44 that forms gate 40, and is disposed between gate 40 and FOX region 32 (i.e., outside of gate 40). Similarly, a second n-type tub or NLDD region 52 is formed in self-alignment with an outer edge of the portion of polysilicon layer 44 that forms gate 42, and is disposed between gate 42 and FOX region 34 (i.e., outside of gate 42). Within first and second NLDD regions 50 and 52 respective p-type lightly doped drain (PLDD) regions or tubs 60 and 62 are formed in self-alignment with corresponding outer edges of the portion of polysilicon layer 44 that forms gates 40 and 42. The NLDD regions 50 and 52 and the PLDD regions 60 and 62 of HV PMOS device 12 are substantially similar to the NLDD and PLDD regions of conventional low voltage logic devices.

HV PMOS device 12 also includes an n-buffer region 66 formed between and in self alignment with gates 40 and 42, and p-drift region 68 formed within n-buffer region 66 and also in self alignment with gates 40 and 42. A third PLDD region or tub, as is described more particularly hereinafter, is disposed within p-drift region 68 and is formed at the same time as the other PLDD regions or tubs 60 and 62.

Oxide spacers 70 and 72 are disposed over and/or upon the sidewalls (not referenced) of gates 40 and 42, respectively. P+ source regions 80 and 82 are respectively formed in self-alignment with the outer oxide spacers 70 and 72. Source n+ taps 90 and 92 are formed adjacent FOX regions 32 and 34, respectively, and are connected with p+ sources 80 and 82 by silicide layers 94 and 96, respectively.

The third PLDD region 104 is formed within a predetermined portion, such as, for example, the central portion, of p-drift region 68. P+ drain region 110 is formed in a predetermined portion, such as, for example, the central portion, of PLDD region 104 and extends through PLDD region 104 into p-drift region 68. P-drift region 68, p+ drain 110 and PLDD region 104 conjunctively form a region (not referenced) of gradually decreasing dopant concentration, i.e., a region in which the p-type dopant concentration decreases from the p+ drain 134 to PLDD region 104 and to p-drift region 68.

Figure 2:
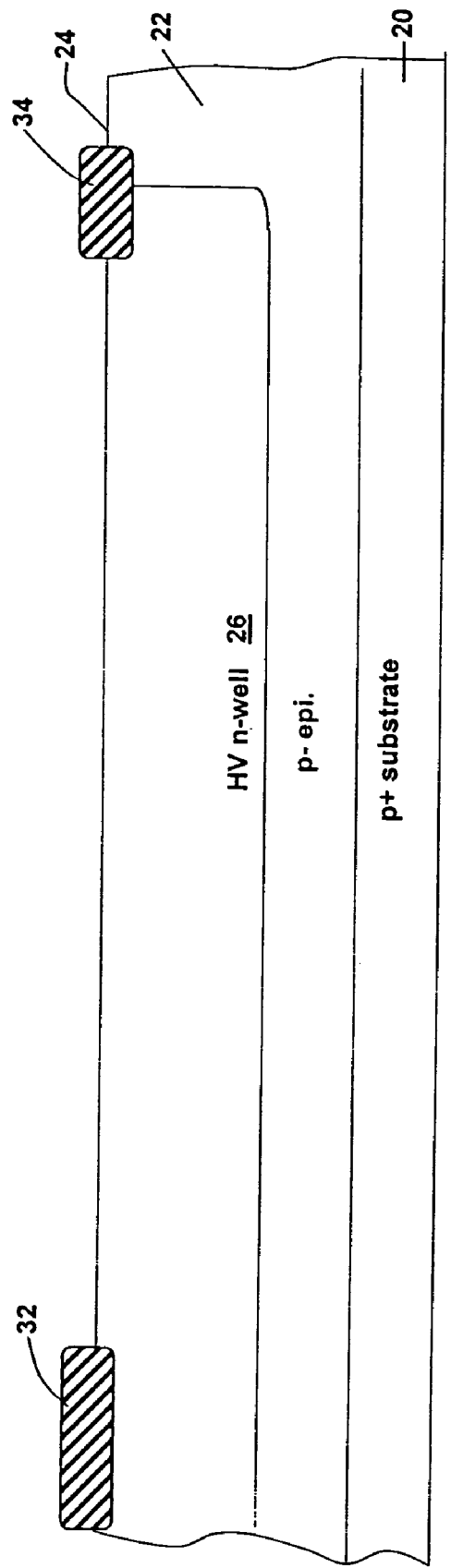
FIGS. 2–7 illustrate selected processes used in fabricating the device of FIG. 1.
Figure 3:
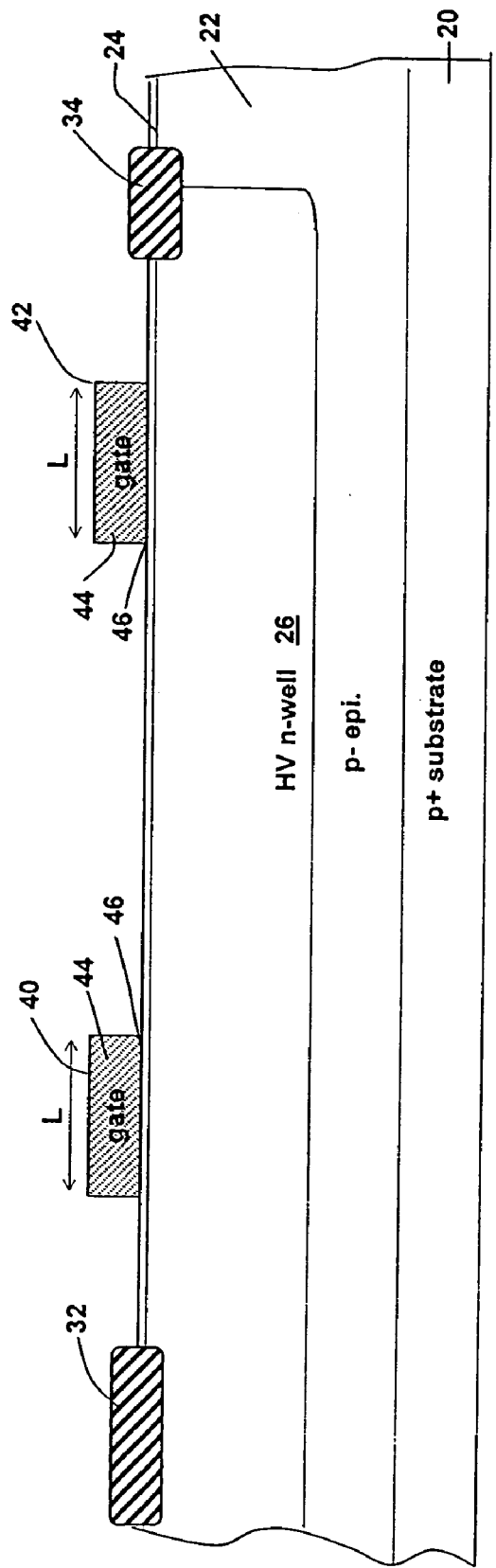

Further features of device 10 are discussed hereinafter with reference to FIGS. 2–7, which illustrate selected processes used in fabricating IC 10. As shown in FIG. 2, FOX regions 32 and 34 are formed on surface 24. As shown in FIG. 3, gates 40 and 42 are formed upon gate oxide layer 46 and between or inside of FOX regions 32 and 34. Gate oxide layer 46 is deposited or formed by oxidizing the exposed surface 24 of epitaxial layer 22. A layer of conductive polysilicon 44 (only a portion of which is shown) is deposited on gate oxide layer 46. The polysilicon layer 44 may be deposited as a highly doped layer or may be doped in a subsequent process. The gate polysilicon layer 44 is masked and etched to remove unwanted portions thereof, thereby forming the insulated gate structures 40 and 42.

Figure 4:
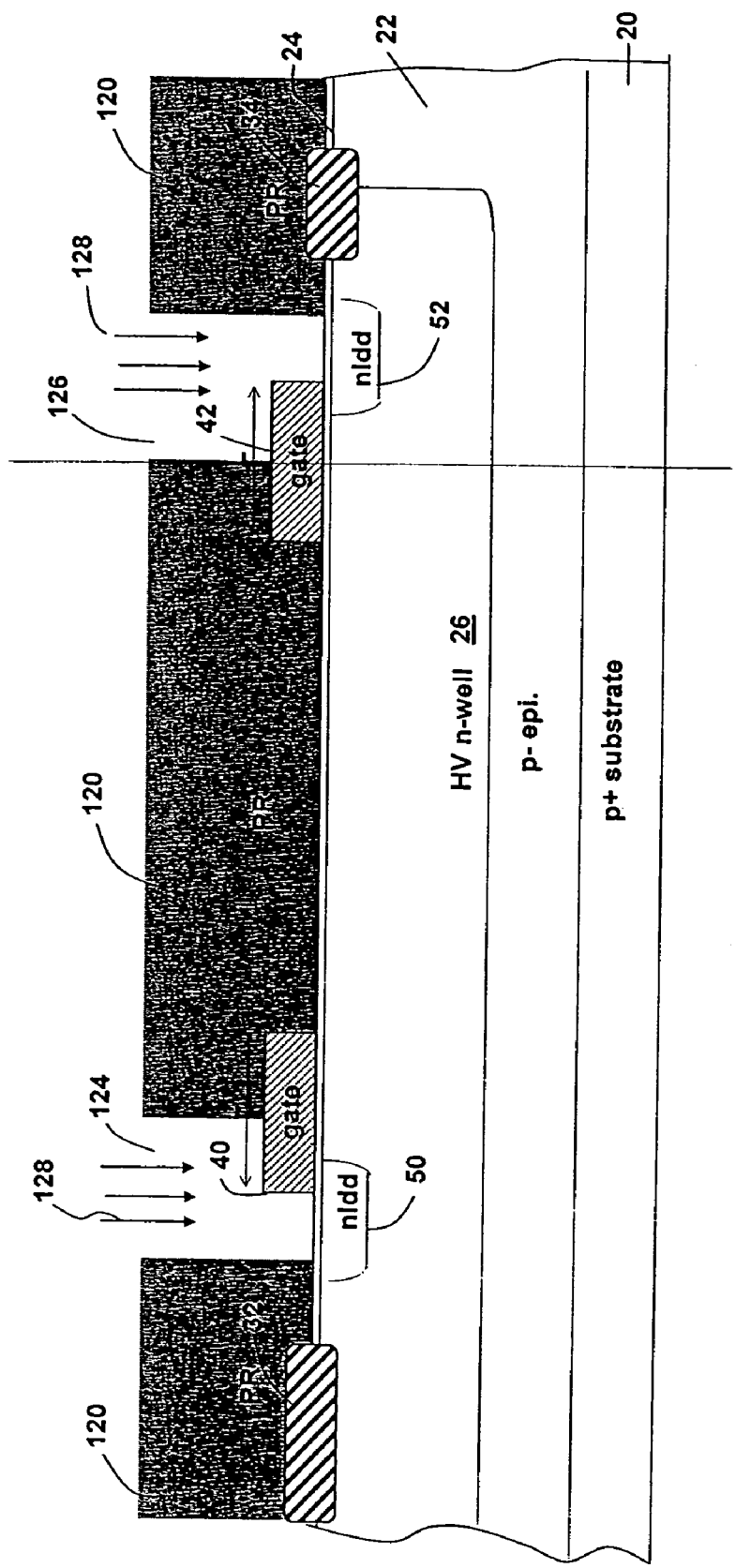

As shown in FIG. 4, a patterned layer of photoresist 120 is deposited over substrate 20. A mask, not shown, enables removal of the unwanted portions of the photoresist layer 120 to form openings 124 and 126 therein via a suitable wet or dry etch process. Openings 124 and 126 in photoresist layer 120 are disposed over and expose the outer edges and outer portions of the upper surface of polysilicon material 44 forming gates 40 and 42 and predetermined portions of the surface of HV n-well 26 adjacent to and outside of gates 40 and 42.

NLDD tubs or regions 50 and 52 are then formed by placing substrate 20 into an ion implantation apparatus where n-type dopants 128 are implanted into the exposed portion of HV n-well 26. The n-type dopants, such as, for example, phosphorous, are implanted to form NLDD tubs or regions 50 and 52 each having a dopant concentration of from approximately 5E16 to approximately 5E18 atoms/cm$^3$ and a depth of from approximately 0.06 to approximately 0.7 micrometers (um). NLDD tubs or regions 50 and 52 are each self-aligned with the outside edge of the polysilicon material 44 of a corresponding one of gates 40 and 42.

The portions of NLDD tubs 50 and 52 that diffuse beneath gates 40 and 42, respectively, partially control the threshold and punch-through voltages of device 12. The channel length of device 12 is determined by the length L of gates 40 and 42. The channel length of the HV PMOS device 12 is scaleable and can be shrunk to submicron or deep-submicron lengths that provide short channel length and therefore low channel resistance. HV n-well 26 has a low dopant concentration, typically around 1e16 atoms/cm$^3$, and device 10 could not support a high drain-to-source voltage without the presence of NLDD tubs 50 and 52 and n-buffer 66. Further, device 12 would have high leakage if there were no NLDD tubs 50, 52 and n-buffer 66. The threshold and punch-through voltages of the HV PMOS device 12 are controlled by the implants forming first and second NLDD regions 50 and 52 and n-buffer region 66. This gives the process and device of the present invention substantial flexibility. Any damage to the crystal lattice structure of epitaxial layer 22 is cured by one or more rapid thermal annealing operations that are short enough to prevent significant diffusion of the ions from the regions of implant.

Figure 5:
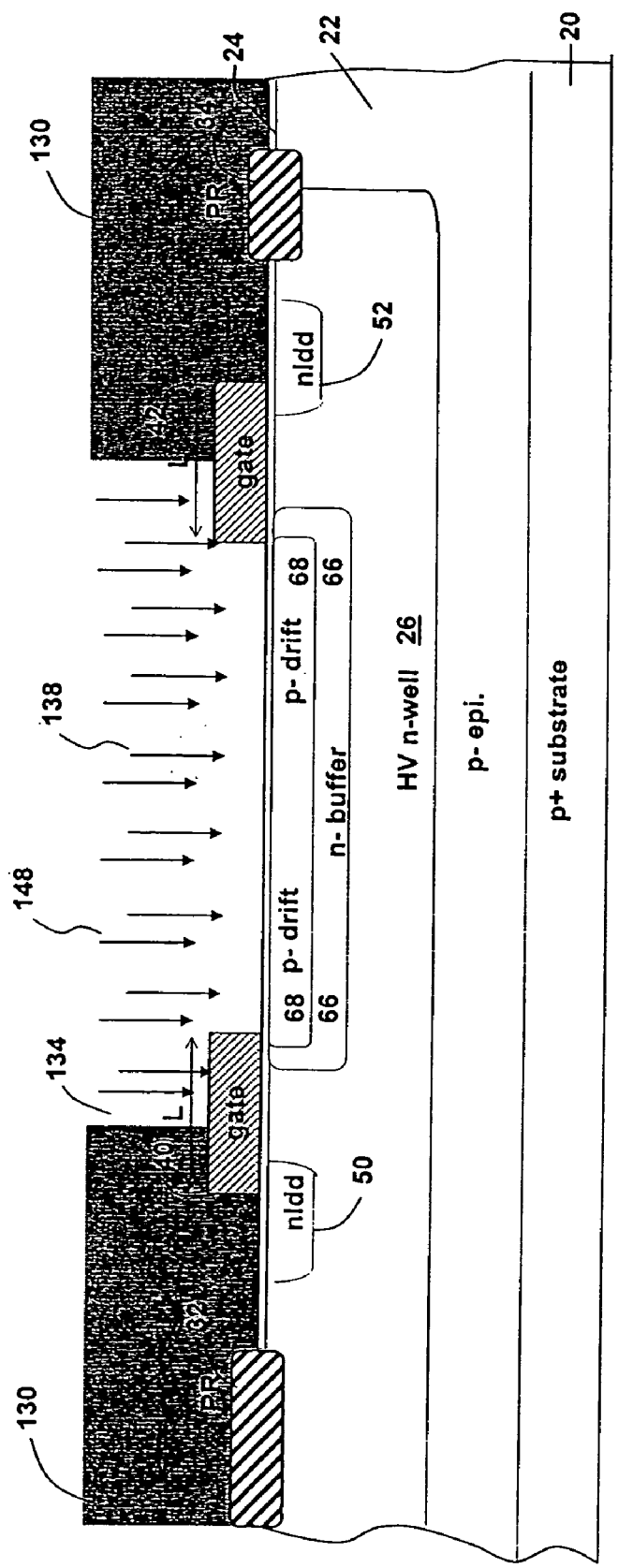

Photoresist mask 120 is removed and a second photoresist mask 130, as shown in FIG. 5, is formed over substrate 20. Mask 130 is patterned, in a manner that is substantially similar to that described above in regard to the patterning of mask 120, to form opening 134 that exposes the inner edges and inner portions of the upper surfaces of polysilicon material 44 of gates 40 and 42 and the surface of HV n-well 26 disposed there between. Substrate 20 is again inserted into an ion implantation apparatus and undergoes a hetero-doping operation to form buffer 66 and drift 68 regions within HV n-well 26 each of which are self-aligned with the inside edges of gates 40 and 42.

More particularly, N-type dopant ions 138, such as, for example, phosphorous, are implanted to form N-type buffer region 66 having an n-type dopant concentration of approximately 5E15 to 5E17 atoms/cm$^3$ and having a depth of from approximately 0.2 to approximately 0.8 micrometers. P-type dopant ions 148, such as, for example, boron ions, are implanted to form P-type drift region 68 having a p-type dopant concentration of approximately 5E16 to 5E18 atoms/cm$^3$ and having a depth of from approximately 0.1 to approximately 0.4 micrometers.

Figure 6:
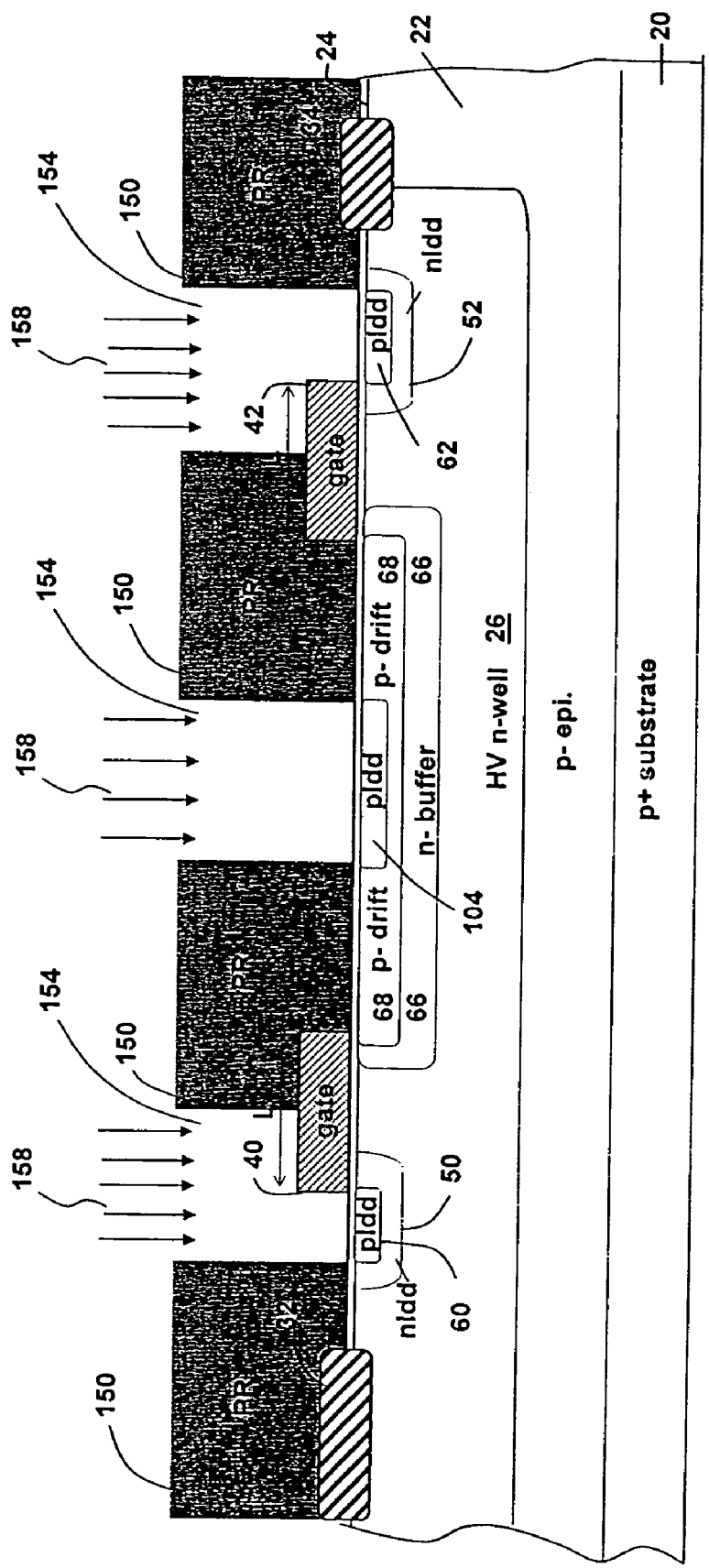

Referring now to FIG. 6, mask 130 is removed by known techniques and a third photoresist mask 150 is formed over substrate 20. Mask 150 is patterned, in a manner that is substantially similar to that described above in regard to the patterning of masks 120 and 130, to form openings 154 therein. Openings 154 expose the outer edge and the outer portions of the upper surface of polysilicon material 44 of gates 40 and 42 and at least a portion of the previously formed NLDD regions 50 and 52. Additionally, one of openings 154 (i.e., the central opening) exposes the surface of the portion of HV n-well 26 within which previously-formed P-type drift region 68 is disposed. Substrate 20 is again inserted into an ion implantation apparatus and undergoes an ion implantation process wherein P-type ions 158, such as, for example, boron fluorinate (BF2), are implanted to form first, second, and third PLDD regions 60, 62 and 104, respectively, each having a p-type dopant concentration of approximately 1E17 to 9E18 atoms/cm$^3$ and a depth of from approximately 0.03 to approximately 0.3 micrometers. The inner side of PLDD regions 60 and 62 are self-aligned with the outer edges of gates 40 and 42, respectively.

It should be noted that, as described above, the inner edges of NLDD tubs or regions 50 and 52 are each self-aligned with the outside edge of the polysilicon material 44 of a corresponding one of gates 40 and 42. Similarly, the inner side of PLDD regions 60 and 62 are each self-aligned with the outside edge of the polysilicon material 44 of a corresponding one of gates 40 and 42. Thus, NLDD tub or region 50 and PLDD tub or region 60 form a stacked hetero-doping rim generally designated 160 (FIG. 1). Similarly, NLDD tub or region 52 and PLDD tub or region 62 form a stacked hetero-doping rim generally designated 162 (FIG. 1).

Figure 7:
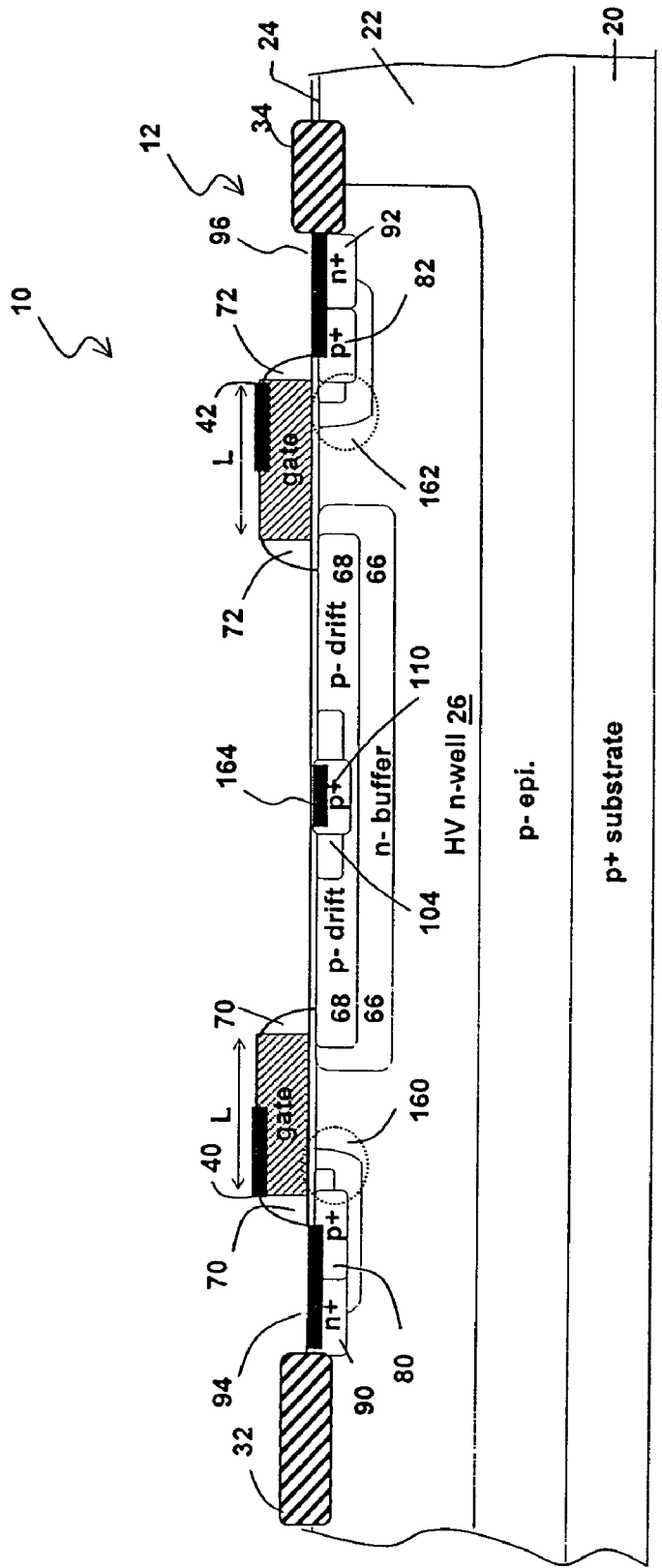

As shown in FIG. 7, sidewall oxide spacers 70 and 72 are formed on the sides of gates 40 and 42, respectively. The additional features shown in FIG. 7 are formed using conventional fabrication steps used in the fabrication of low voltage logic devices. More particularly, source n+ tap regions 90 and 92, p+ source regions 80 and 82, and drain region 110 are fabricated using conventional masking and implanting steps. The p+ source and drain regions 80, 82 and 110, respectively, each have a p+ dopant concentration of approximately 1E19 to 1E21 atoms/cm$^3$. Layers of silicide 94 and 96 are formed using conventional steps known to those of ordinary skill in the art over the outside portion of the upper or top surfaces of gates 40 and 42, over the upper surface of source n+ tap regions 90 and 92, and over the upper surface of p+ source regions 80 and 82, respectively, to increase their conductivity. Similarly, a layer of silicide 164 is formed over p+ drain region 110.

In the embodiment shown, HV PMOS device 12 includes only two gate stripes 40 and 42. However, it is to be understood that the HV PMOS device of the present invention typically includes a plurality of gate stripes and the corresponding structure disclosed herein (i.e., a repeating pattern including an n+ tap, p+ source, stacked hetero-doping rim, gate stripe, enhanced RESURF drift region, and step drain regions) formed between the FOX regions 32, 34. In addition, the FOX regions 32, 34 serve as lateral isolation regions, with n-type and p-type guard rings (not shown in the figures) to separate the HV PMOS device from other low voltage devices.

It should be particularly noted that no high-temperature oxide growth process occurs or is undertaken after the implantation of p-type ions 148 to form p-drift region 68. Thus, the impurity segregation that occurs in conventional RESURF devices during formation or growth of an overlying oxide layer is substantially reduced if not entirely eliminated.

It should also be particularly noted that device 12 has a relatively small channel length L due to the self-alignment of rims 160 and 162, n-buffer region 66, and p-drift region 68, with gates 42 and 46. The n-buffer region 66 and the NLDD regions 50 and 52 prevent punch-through from the p-drift region 68 to the p+ source regions 80 and 82, and thereby increase the punch-through voltage of device 12. The threshold voltage of HV PMOS device 12 is also controlled by the implants forming NLDD regions 50 and 52 and n-buffer region 66. This gives the process and device of the present invention increased flexibility.

As described above, P-drift region 68, p+ drain 110 and PLDD region 104 conjunctively form a region (not referenced) of gradually decreasing dopant concentration, i.e., a region in which the p-type dopant concentration decreases from the p+ drain 134 to PLDD region 104 and to p-drift region 68. More particularly, the dopant concentration of this region gradually decreases from a concentration of from approximately 1E19 to 1E21 atoms/cm$^3$ adjacent drain region 134 to a concentration of from approximately 5E16 to 5E18 atoms/cm$^3$ proximate gate regions 40 and 42. This region of gradual doping concentration change/profile within p-drift region 68 evenly distributes, and thus improves the uniformity of, the electric field in the area of drain region 134. Further, the region of gradual dopant concentration change reduces the likelihood that breakdown will occur in the drain region/area and increases the safe operating area of the device.

It should still further be particularly noted that the n-buffer region 66 also facilitates the pinch off of the p-drift region 68 by the depletion area at off-state for the device enhanced RESURF. In an ideal device, the on resistance is minimal and the breakdown voltage is high. But prior art high voltage devices require a trade off between lowering on resistance and increasing breakdown voltage. As one improves, the other gets worse because both are controlled at least in part by the doping of the drift region. Those skilled in the art know that on resistance is reduced by increasing the doping of the p-drift region. However, increased doping in the p-drift region reduces the junction depletion region and thereby lowers the junction avalanche breakdown voltage, which is determined by the width of the depletion region which is, in turn, inversely proportional to the concentration in doping at the junction. If the p-drift region is highly doped, the on resistance is low but the depletion region is small and the avalanche breakdown voltage is reduced. If the p-drift region is lightly doped, the depletion region is wider and breakdown voltage increases, but the on resistance is higher due to the lower doping. Since the dopant concentration of the HV n-wells of conventional devices is typically much lower than the p-drift doping concentration, the depletion region in the p-drift region is relatively small. In contrast, the doping of the n-buffer layer 66 of the present invention is increased to a much greater level than the doping of the HV n-well layer 26. As such, at a similar voltage bias with similar depletion charges of the junction, the depletion region extension in n-buffer region 66 becomes small, but more depletion region extension occurs in p-drift region 68 relative to a conventional device in which no n-buffer layer is disposed beneath the p-drift region.

By suitably trading-off between the doping and the junction depth of the p-drift region 68 to the doping and the junction depth of the n-buffer region 66, the depletion region in the p-drift region 68 is extended to the surface of the device, with enhanced reduced surface field, and pinch-off most of the p-drift region 68. Because the depletion region has been greatly increased, the HV PMOS device 12 of the present invention has an increased breakdown voltage. In other words, for the same or similar breakdown voltages as a conventional device, the doping concentration of p-drift region 68 of HV PMOS device 12 is increased resulting in a reduced on-state resistance. Also, the sensitivity of p-drift region 68 to impurity segregation is further reduced due to a higher doping concentration in p-drift region 68.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed is:

1. An HV PMOS device, comprising:
   a substrate having an HV well of a first polarity type formed in an epitaxial layer of a second polarity type opposite said first polarity type;
   at least one pair of field oxide regions disposed on a surface of the substrate and at least partially over the HV well;
   at least one pair of insulated gates on the substrate between each pair of field oxide regions, said gates having inner edges facing each other and outer edges facing corresponding one of the field oxide regions;
   stacked hetero-doping rims disposed in the HV well and in self-alignment with the outer edges of the gates;
   a buffer region of the first polarity type formed in the HV well between and in self-alignment with the inner edges of the gates;
   a drift region of the second polarity type formed in the buffer region between and in self-alignment with the inner edges of the gates;
   a drain region of the second polarity type formed within said drift and buffer regions; and
   source tap regions formed proximate said field oxide regions.

2. The HV PMOS device of claim 1, wherein said stacked hetero-doping rims comprise first and second tub regions of the first polarity type and first and second tub regions of the second polarity type formed within said first and second tub regions of the first polarity type.

3. The HV LDMOS device of claim 2, wherein said first and second tub regions of the first polarity type have a dopant concentration of from approximately 5E16 to approximately 5E18 atoms/cm$^3$.

4. The HV LDMOS device of claim 3, wherein said first and second tub regions of the second polarity type have a dopant concentration of from approximately 1E17 to approximately 9E18 atoms/cm$^3$.

5. The HV PMOS device of claim 1, wherein said drift region comprises a region of gradual dopant concentration change wherein the dopant concentration gradually decreases from a relatively high dopant concentration proximate said drain to a significantly lower dopant concentration proximate said gates.

6. The HV PMOS device of claim 5, wherein said region of gradual dopant concentration change comprises a third tub region of the second polarity type within the drift region, a portion of said third tub region implanted with dopants of the second polarity type to thereby form the drain region.

7. The HV PMOS device of claim 6, wherein said third tub region is doped to a dopant concentration of from approximately 1E17 to approximately 9E18 atoms/cm$^3$.

8. The HV PMOS device of claim 6, wherein said drain region is doped to a dopant concentration of from approximately 1E19 to approximately 1E21 atoms/cm$^3$.

* * * * *